United States Patent

Maiti et al.

[11] Patent Number: 6,027,961
[45] Date of Patent: Feb. 22, 2000

[54] CMOS SEMICONDUCTOR DEVICES AND METHOD OF FORMATION

[75] Inventors: Bikas Maiti; Philip J. Tobin; C. Joseph Mogab; Christopher Hobbs, all of Austin, Tex.; Larry E. Frisa, Radebeul bei Dresden, Germany

[73] Assignee: Motorola, Inc., Schaumburg, Ill.

[21] Appl. No.: 09/107,963

[22] Filed: Jun. 30, 1998

[51] Int. Cl.[7] .................................................. H01L 21/8238
[52] U.S. Cl. ......................... 438/199; 438/584; 438/592
[58] Field of Search ..................................... 438/197, 199, 438/584, 592

[56] References Cited

U.S. PATENT DOCUMENTS

| | | | |
|---|---|---|---|
| 4,605,947 | 8/1986 | Price et al. | 357/23.15 |
| 5,268,590 | 12/1993 | Pfiester et al. | 257/764 |
| 5,457,580 | 10/1995 | Lu et al. | 359/361 |
| 5,600,169 | 2/1997 | Burgener et al. | 257/352 |
| 5,923,999 | 7/1999 | Balasubramanyam et al. | 438/592 |

Primary Examiner—John F. Niebling
Assistant Examiner—Christopher Lattin

[57] ABSTRACT

In one embodiment, a metal layer (18) is formed over a gate dielectric layer (14, 16) on a semiconductor substrate. A masking layer (20) is patterned to mask a portion of the metal layer (18). An exposed portion of the metal layer (18) is nitrided to form a conductive nitride layer (24). The masking layer (20) is removed and the conductive nitride layer (24) is patterned to form a first gate electrode (23) having a first work function value, and the conductive layer (18) is patterned to form a second gate electrode (25) having a second work function value which is different from that of the first work function value.

17 Claims, 3 Drawing Sheets

CM OS SEMICONDUCTOR DEVICES AND METHOD OF FORMATION

FIELD OF THE INVENTION

The present invention relates generally to semiconductor devices, and specifically to Complementary Metal Oxide Semiconductor Devices and the formation thereof.

BACKGROUND OF THE INVENTION

For high performance semiconductors, there is a migration towards the use of metal gates in order to overcome problems with polysilicon depletion. The semiconducting nature of the polysilicon gate electrode causes band-bending or a potential well in the gate. Carriers are confined over the dimensions comparable to their wave lengths. Corresponding charge distributions in the polysilicon layer result in a finite bias-dependent nature of the gate electrode capacitance ($C_P$), arising from the polysilicon depletion effect. As gate oxides get thinner, in conjunction with scaling in Complementary Metal Oxide Semiconductor (CMOS) technologies, the increase in gate oxide capacitance ($C_{OX}$) makes $C_{OX}$ comparable to the capacitance of the polysilicon gate electrode over a range of gate bias near the threshold voltage of the device. This results in an undesirable overall reduction in total gate capacitance ($C_G$).

This effect is even more critical when a semiconductor device is operating in an inversion mode of operation, and can cause a decrease in overall capacitance by approximately 30% if the carrier concentration in the polysilicon gate electrode is below $10^{20}/cm^3$. Too much doping, such as doping for P+ gates which can increase $C_P$, causes threshold voltage ($V_t$) instability.

It is known that use of a metal gate can eliminate the polysilicon depletion effect. It is also well known that polysilicon gates have a high resistivity resulting in the need for siliciding the gates to reduce the overall resistivity. In some design environments, where it is not possible or desirable to silicide all the gates, such as SRAMs where not all portions are silicided due to a need for metal interconnect layers, the high resistivity of polysilicon gates is a disadvantage. In addition, when fully depleted silicon on insulator (FDSOI) technology is used, it is not possible achieve optimum $V_t$'s through the use of polysilicon gates at practical SOI thicknesses. In addition, the use of polysilicon gates is inconsistent with the use of high permittivity (high-k) metal oxide gate dielectrics, where a high-k value is generally greater than 3.9, in that the possibility exists for silicon from the polysilicon to react with the metal-oxide causing a contamination of the metal oxide gate dielectric affecting its high-k characteristics.

In CMOS technology, N+ poly and P+ poly are used as gates in NMOS and PMOS devices respectively. N+ poly and P+ poly correspond to work functions of 4.1 eV for N+ poly and 5.2 eV for P+ poly gates. Current device dimensions require a silicon channel doping of greater than $1E17/cm^3$ to avoid short channel effects. When replacing dual-doped silicon gates, a work function of the metal needs to be chosen. One known method has been to choose the metal such that it has a mid-gap work function which would allow for symmetric $V_t$s for both NMOS and PMOS devices. However, due to the doping requirements needed to avoid short channel effects, a mid gap metal results in $V_t$s which are large for low voltage, low power, high performance devices. Therefore, it is desirable to have a method for providing low $V_t$s for both NMOS and PMOS devices.

DETAILED DESCRIPTION OF A PREFERRED EMBODIMENT

Figure 1:
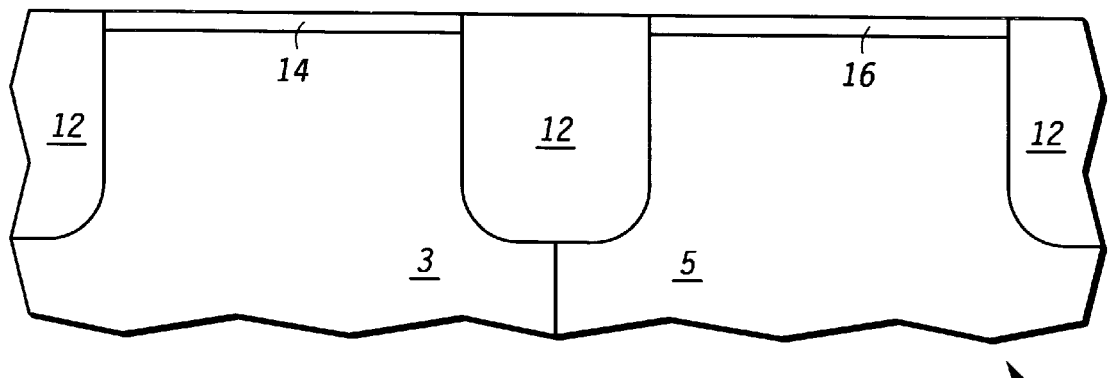
FIGS. 1 through 7 illustrate cross sectional views of the steps used to form a semiconductor device in accordance with the present invention.

Shown in FIG. 1 is a portion 10 of a semiconductor device structure in accordance with one embodiment of the present invention. The semiconductor device structure comprises a semiconductor substrate having a first region 3 of a first conductivity type, a second region 5 of a second conductivity type, field isolation regions 12, a first gate dielectric layer 14, and a second gate dielectric layer 16. In one embodiment, the semiconductor substrate is a monocrystalline silicon substrate. Alternatively the semiconductor substrate may be a silicon on insulator substrate, a germanium substrate, a silicon-germanium substrate, a silicon on sapphire substrate or the like.

In one embodiment, field isolation regions 12 are trench isolation regions which are formed using conventional etching and chemical mechanical polishing techniques. Alternatively, field isolation regions 12 may be field oxide regions which are formed using conventional techniques such as local oxidation of silicon, (LOCOS), poly buffered LOCOS (PBL), polysilicon encapsulated local oxidation (PELOX) or the like. In one embodiment gate dielectric layer 14 and gate dielectric layer 16 are thermal silicon dioxide layers which are formed by thermally oxidizing a portion of first region 3 and a portion of second region 5, respectively. Alternatively, gate dielectric layer 14 and gate dielectric layer 16 may be a layer of silicon nitride, a layer of silicon oxynitride, a layer of chemically vapor deposited silicon dioxide, a nitrided oxide layer, a high-k dielectric material such as a metal oxide, or a combination thereof. It should be appreciated that gate dielectric layer 14 and gate dielectric layer 16 may be formed simultaneously. Alternatively, gate dielectric layer 14 and gate dielectric layer 16 may be formed at different times and with different gate dielectric materials.

Figure 2:
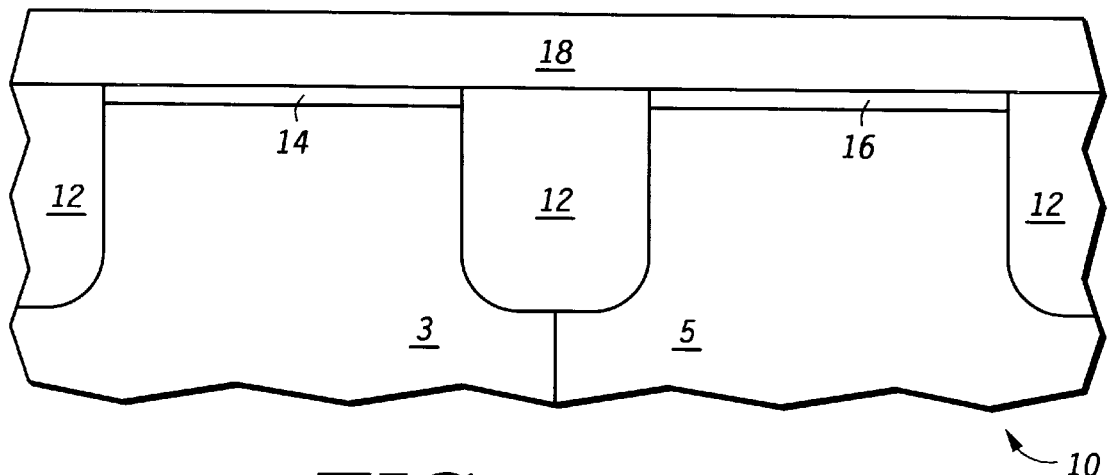

In FIG. 2 a conductive layer 18 is formed overlying first region 3 and second region 5. In one embodiment, conductive layer 18 is a metal layer such as tantalum, tungsten, molybdenum, zirconium, hafnium, vanadium, chromium, niobium, titanium, or the like. Alternatively, conductive layer 18 may be a metal silicide layer such as tantalum silicide, tungsten silicide, molybdenum silicide, titanium silicide or the like. Conductive layer 18 may be formed using conventional chemical vapor deposition techniques or sputtering techniques.

Figure 3:
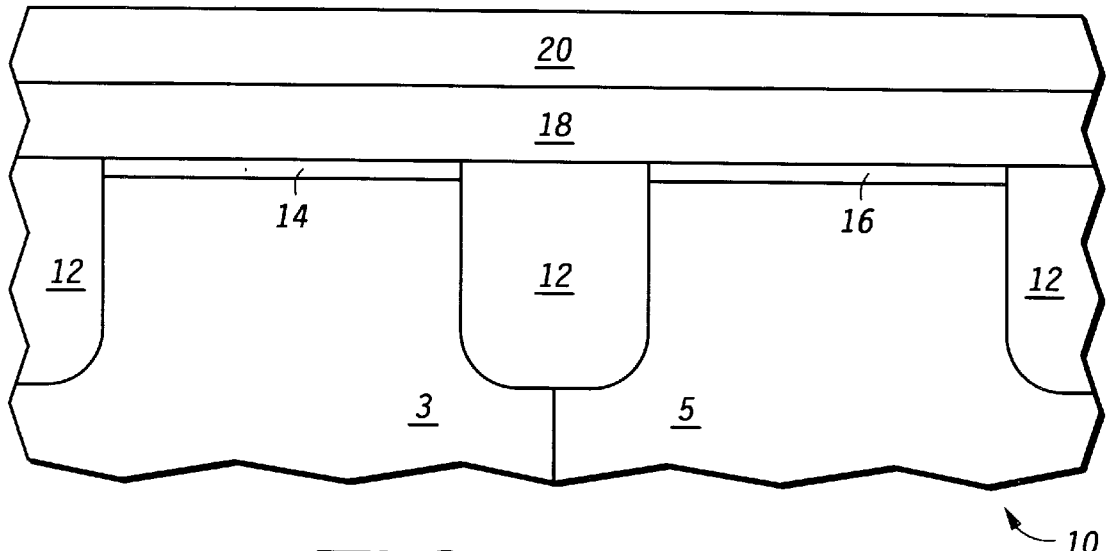

In FIG. 3 a masking layer 20 is formed overlying conductive layer 18. In one embodiment, masking layer 20 is a layer of silicon nitride which is deposited using rapid thermal chemical vapor deposition. Alternatively, masking layer 20 may be a layer of photoresist or a layer of polysilicon.

Figure 4:
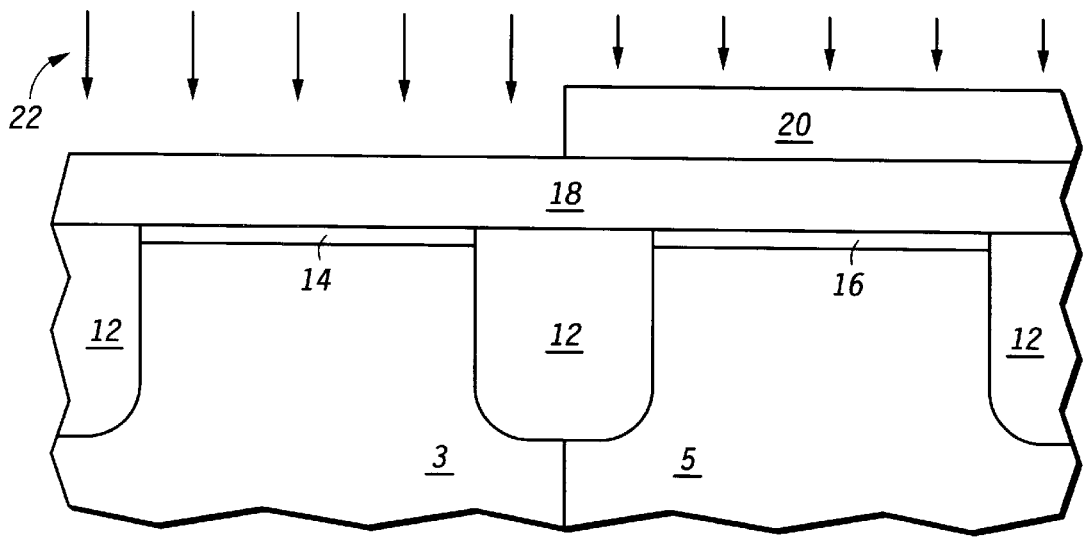

In FIG. 4 masking layer 20 is patterned to expose a first portion of conductive layer 18 and to leave a remaining portion of the masking layer 20 overlying a second portion of conductive layer 18. The exposed portion of conductive layer 18 is then nitrided to form a conductive nitride layer 24 that overlies first region 3. In one embodiment, conductive nitride layer 24 is formed by implanting nitrogen ions 22 into the exposed portion of conductive layer 18. It should be appreciated that the remaining portion of masking layer 20 prevents nitrogen ions from being implanted into the second portion of conductive layer 18. After nitrogen implantation, the semiconductive device structure is annealed to form conductive nitride layer 24. The semiconductor device structure may be annealed using conventional furnaces or rapid thermal annealing systems. It should be appreciated that if masking layer 20 is formed using photoresist, then it must be removed prior to annealing. Alternatively, conductive nitride layer 24 may be formed by annealing the exposed portion of conductive layer 18 in a nitrogen ambient, such as ammonia, or by exposing the exposed portion of conductive layer 18 to a plasma comprising nitrogen. Note, that if conductive layer 18 is a layer of tantalum, tungsten, molybdenum, zirconium, hafnium, vanadium, chromium, niobium, or titanium, then conductive nitride layer 24 will be a layer of tantalum nitride, tungsten nitride, molybdenum nitride, zirconium nitride, hafnium nitride, vanadium nitride, chromium nitride, niobium nitride, or titanium nitride respectively. Similarly, if conductive layer 18 is a layer of tantalum silicide, tungsten silicide, molybdenum silicide, or titanium silicide, then conductive nitride layer 24 will be a layer of tantalum silicon nitride, tungsten silicon nitride, molybdenum silicon nitride, or titanium silicon nitride, respectively.

Figure 5:
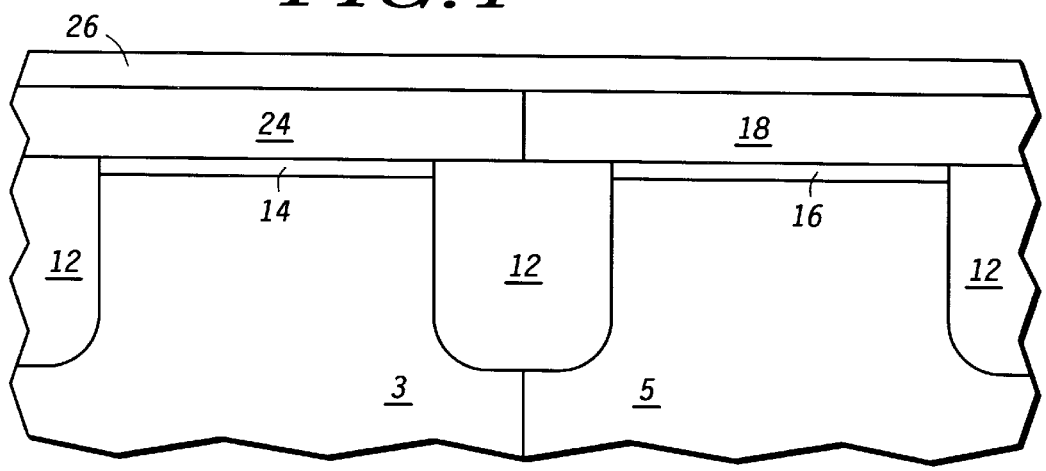

In FIG. 5 a capping layer 26 is formed overlying conductive nitride layer 24 and the remaining portion of conductive layer 18. In one embodiment, capping layer 26 is a layer of silicon nitride which is deposited using rapid thermal chemical deposition. Alternatively, capping layer 26 may be a layer of polysilicon which is also deposited using rapid thermal chemical vapor deposition. Note, that if capping layer 26 is formed using polysilicon then a barrier layer, such titanium nitride, may have to be formed between the polysilicon layer and the underlying conductive nitride layer 24 and the conductive layer 18 to prevent silicidation between the polysilicon layer and the underlying conductive metal layer 18 and the conductive nitride layer 24. It should be appreciated that capping layer 26 is used to prevent oxidation of conductive nitride layer 24 and the remaining portion of conductive layer 18 during subsequent processing.

Figure 6:
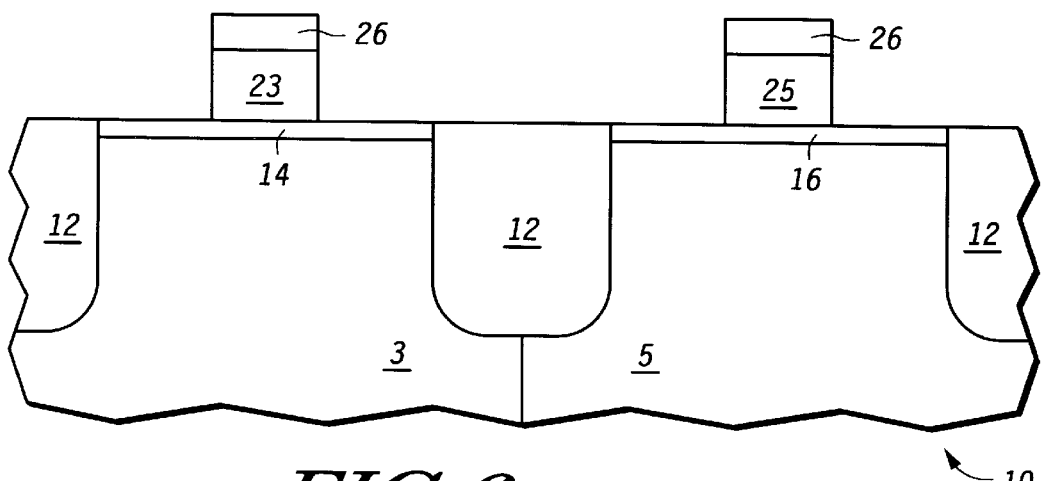

In FIG. 6 conductive nitride layer 24 is patterned to form a first gate electrode 23 overlying first region 3, and the remaining portion of conductive layer 18 is patterned to form a second gate electrode 25 overlying second region 5. As shown in FIG. 6 a portion of capping layer 26 is left overlying first gate electrode 23 and overlying second gate electrode 25. It should be appreciated that conductive nitride layer 24 and the remaining portion of conductive layer 18 may be patterned either simultaneously or in separate steps using conventional etching techniques.

Figure 7:
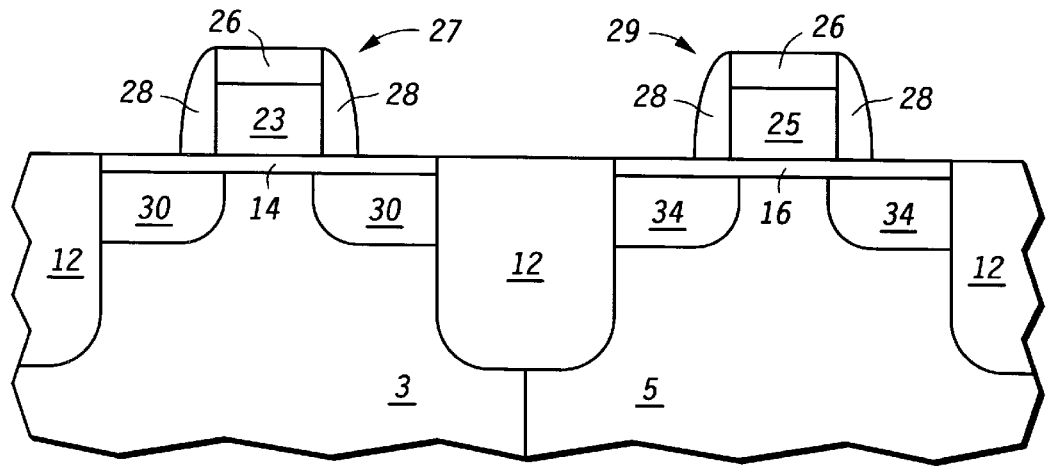

In FIG. 7 sidewall spacers 28 are formed along the sidewalls of first gate electrode 23 and second gate electrode 25. In one embodiment sidewall spacers 28 are silicon nitride sidewall spacers which are formed using rapid thermal chemical vapor deposition and conventional etching techniques. It should be appreciated that sidewall spacers 28 prevent first gate electrode 23 and second gate electrode 25 from being oxidized during subsequent processing steps. In addition, source drain regions 30 having a second conductivity type are formed within first region 3 and source drain regions 34 having a first conductivity type are formed in second region 5 to form a first transistor 27 within first region 3 and a second transistor 29 within second region 5. It should be appreciated that gate electrode 23 has a work function which is different from that of gate electrode 25. For example, if first region 3 has N-type conductivity and second region 5 has P-type conductivity, then the work function of gate electrode 23 will be greater than that of gate electrode 25.

Figure 8:
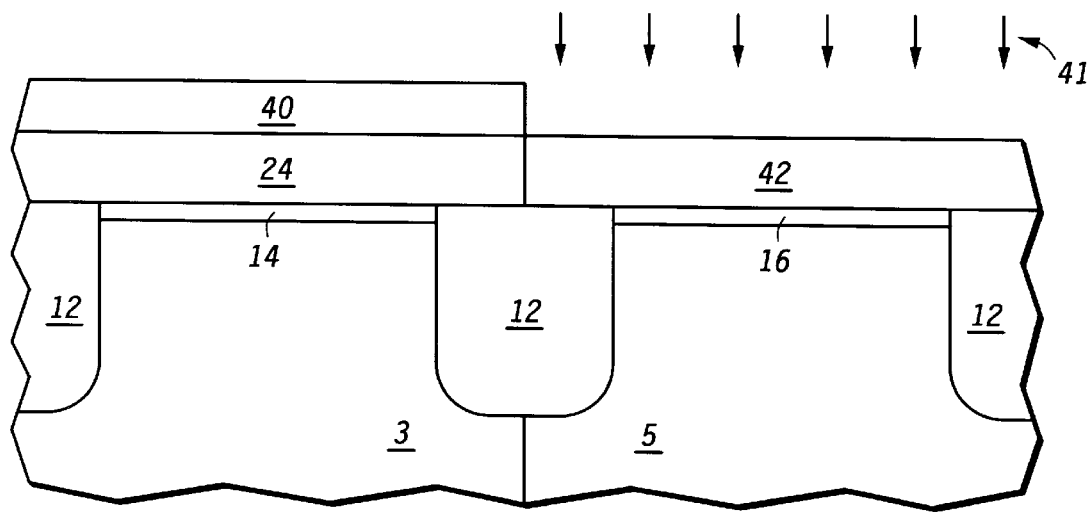
FIGS. 8 through 9 illustrate cross sectional views of the steps used to form a semiconductor device in accordance with an alternative embodiment of the present invention.

Shown in FIG. 8 is an alternative embodiment of the present invention, wherein masking layer 20, shown in FIG. 4, is removed after conductive nitride layer 24 has been formed. Then a second masking layer 40 is formed overlying conductive nitride layer 24 to expose the remaining portion of conductive layer 18. In one embodiment, masking layer 40 is a layer of silicon nitride which is deposited using rapid thermal chemical vapor deposition. Alternatively, masking layer 40 may be a layer of photoresist or a layer of polysilicon. After masking layer 40 is formed the remaining portion of conductive layer 18 is then nitrided to form a conductive nitride layer 42. In one embodiment, nitrogen ions 41 are implanted into the remaining portion of conductive layer 18 and then the semiconductor device structure 15 is annealed to form conductive nitride layer 42. Alternatively conductive nitride layer 42 may be formed by annealing the remaining portion of conductive layer 18 in a nitrogen ambient, such as ammonia, or by exposing the remaining portion of conductive layer 18 to a plasma comprising nitrogen. Note, that if conductive layer 18 is a layer of tantalum, tungsten, molybdenum, zirconium, hafnium, vanadium, chromium, niobium, or titanium, then conductive nitride layer 42 will be a layer of tantalum nitride, tungsten nitride, molybdenum nitride, zirconium nitride, hafnium nitride, vanadium nitride, chromium nitride, niobium nitride, or titanium nitride respectively. Similarly, if conductive layer 18 is a layer of tantalum silicide, tungsten silicide, molybdenum silicide, or titanium silicide, then conductive nitride layer 42 will be a layer of tantalum silicon nitride, tungsten silicon nitride, molybdenum silicon nitride, or titanium silicon nitride, respectively.

Figure 9:
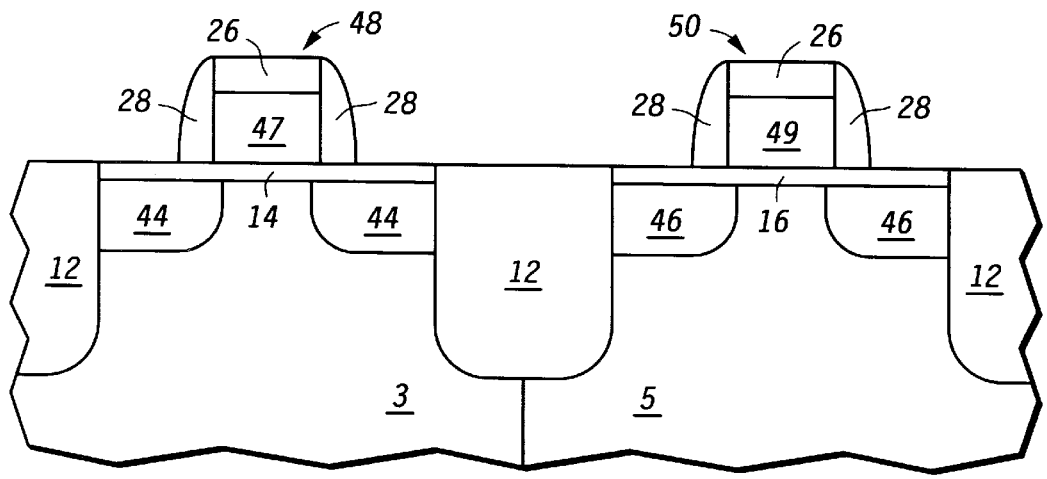

In FIG. 9 masking layer 40 is removed and processing continues as previously described in FIGS. 5–8. This results in the formation of a first transistor 48 overlying first region 3 and a second transistor 50 overlying second region 5. It should be appreciated that the gate electrode 47 of transistor 48 comprises a portion of conductive nitride layer 24 and has a first work function value, and that the gate electrode 49 of transistor 50 comprises a portion of conductive nitride layer 42 and has a second work function value. For example, transistor 48 may be formed to have a tantalum nitride gate electrode having a first work function value and transistor 50 may be formed to have a tantalum nitride gate electrode with a second work function value. More specifically, if first region 3 has N-type conductivity, second region 5 has P-type conductivity, then the tantalum nitride gate electrode for first transistor 48 would be formed to have a work function value which is greater than that of the tantalum nitride gate electrode for transistor 50. Note, the work function of a conductive nitride increases with increasing nitrogen concentration. Therefore, gate electrodes with different work functions can be formed by forming conductive nitride layers with different nitrogen concentrations. Specifically, a non-stoichiometric metal-rich conductive nitride will have a lower work function, than that of a stoichiometric conductive nitride because it has a smaller nitrogen concentration.

The foregoing description and illustrations contained herein demonstrate many of the advantages associated with the present invention. In particular, a CMOS device structure utilizing gate electrodes having different work functions in order to optimize device performance has been disclosed.

Thus it is apparent that there has been provided, in accordance with the invention, a CMOS device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for forming a semiconductor device comprising the steps of:
   providing a semiconductor substrate, the semiconductor substrate having a first region of a first conductivity type and a second region of a second conductivity type;
   forming a first conductive nitride layer overlying the first region of the semiconductor substrate;
   forming a second conductive nitride layer overlying the second region of the semiconductor substrate;
   patterning the first conductive nitride layer to form a first gate electrode overlying the first region, the first gate electrode having a first work function value; and
   patterning the second conductive nitride layer to form a second gate electrode overlying the second region, the second gate electrode having a second work function value, wherein the second work function value is less than the first work function value.

2. The method of claim 1, wherein the first conductive nitride layer is further characterized as having a first nitrogen concentration.

3. The method of claim 2, wherein the second conductive nitride layer is further characterized as having a second nitrogen concentration, which is less than the first nitrogen concentration.

4. The method of claim 1, wherein the second conductive nitride layer and the first conductive nitride layer are patterned simultaneously.

5. The method of claim 1, wherein the first conductive nitride layer is further characterized as a first tantalum nitride layer.

6. The method of claim 5, wherein the second conductive nitride layer is further characterized as second tantalum nitride layer.

7. A method for forming a semiconductor device comprising the steps of:
   providing a semiconductor substrate, the semiconductor substrate having a first region of a first conductivity type and a second region of a second conductivity type;
   forming a conductive layer overlying the semiconductor substrate, the conductive layer having a first portion overlying the first region and a second portion overlying the second region;
   nitriding the first portion of the conductive layer to form a conductive nitride layer overlying the first region;
   patterning the conductive nitride layer to form a first gate electrode overlying the first region; and
   patterning the conductive layer to form a second gate electrode overlying the second region.

8. The method of claim 7, wherein the conductive nitride layer is further characterized as a metal-rich nitride layer.

9. The method of claim 7, wherein the conductive nitride layer is further characterized as a stoichiometric nitride layer.

10. The method of claim 7, wherein the conductive nitride layer and the conductive layer are patterned simultaneously.

11. The method of claim 7, wherein the conductive layer is further characterized as a tantalum layer.

12. A method for forming a semiconductor device comprising the steps of:
   providing a semiconductor substrate, the semiconductor substrate having a first region of a first conductivity type and a second region of a second conductivity type;
   forming a metal layer overlying the semiconductor substrate, the metal layer having a first portion overlying the first region and a second portion overlying the second region;
   nitriding the first portion of the metal layer to form a first metal nitride layer overlying the first region;
   nitriding the second portion of the metal layer to form a second metal nitride layer overlying the second region;
   patterning the first metal nitride layer to form a first gate electrode overlying the first region, the first gate electrode having a first work function value; and
   patterning the second metal nitride layer to form a second gate electrode overlying the second region, the second gate electrode having a second work function value, wherein the second work function value is less than the first work function value.

13. The method of claim 12, wherein the first metal nitride layer is further characterized as having a first nitrogen concentration.

14. The method of claim 13, wherein the second metal nitride layer is further characterized as having a second nitrogen concentration which is less than the first nitrogen concentration.

15. The method of claim 12, wherein the second metal nitride layer and the first metal nitride layer are patterned simultaneously.

16. The method of claim 12, wherein the first metal nitride layer is further characterized as a first tantalum nitride layer.

17. The method of claim 16, wherein the second metal nitride layer is further characterized as second tantalum nitride layer.

* * * * *